United States Patent [19]
Zhang

[11] Patent Number: 5,600,280
[45] Date of Patent: Feb. 4, 1997

[54] DIFFERENTIAL AMPLIFIER AND VARIABLE DELAY STAGE FOR USE IN A VOLTAGE CONTROLLED OSCILLATOR

[75] Inventor: Zhong-Xuan Zhang, Fremont, Calif.

[73] Assignee: Cirrus Logic, Inc., Fremont, Calif.

[21] Appl. No.: 404,133

[22] Filed: Mar. 13, 1995

Related U.S. Application Data

[63] Continuation of Ser. No. 169,158, Dec. 17, 1993, abandoned.

[51] Int. Cl.$^6$ ........................................... H03B 5/24
[52] U.S. Cl. ........................... 331/57; 327/180; 327/261; 327/272; 330/252; 330/253
[58] Field of Search ....................... 330/252, 253; 331/57; 327/180, 179, 261, 269, 272, 309

[56] References Cited

U.S. PATENT DOCUMENTS

| | | | |
|---|---|---|---|
| 4,780,687 | 10/1988 | Ducourant | 330/253 |
| 4,893,036 | 1/1990 | Hester et al. | 307/603 |
| 5,206,609 | 4/1993 | Mijuskovic | 331/57 |
| 5,227,681 | 7/1993 | Koyama et al. | 307/494 |
| 5,347,183 | 9/1994 | Phelan | 327/309 X |

OTHER PUBLICATIONS

Ansgar Pottbacker et al., "1993 Digest of Technical Papers," 1993 IEEE International Solid–State Circuits Conference, vol. 36, Feb. 1993.
Ian A. Young et al., "1993 Digest of Technical Papers," 1993 IEEE International Solid–State Circuits Conference, vol. 36, Feb. 1993.
Mark Horowitz et al., "1993 Digest of Technical Papers," 1993 IEEE International Solid–State Circuits Conference, vol. 36, Feb. 1993.
Nhat M. Nguyen et al., "1993 Digest of Technical Papers," 1993 IEEE International Solid–State Circuits Conference, vol. 36, Feb. 1993.
Thomas H. Lee et al., "1993 Digest of Technical Papers," 1993 IEEE International Solid–State Circuits Conference, vol. 36, Feb. 1993.
Mark Horowitz et al., "1993 Slide Supplement to the Digest of Technical Papers," 1993 IEEE International Solid–State Circuits Conference, vol. 36, Feb. 1993.
Alan B. Grebene, "Bipolar and MOS Analog Integrated Circuit Design" 541–543 and 627–678 John Wiley & Sons (1984).
"CMOS Integrated Circuits," RCA Solid State Databook 708–730 (1983).
Floyd Martin Gardner, "Phaselock Techniques" 94–107 John Wiley & Sons (1979).
Ian A. Young, Jeffrey K. Greason, and Keng L. Wong in "A PLL Clock Generator with 5 to 110 MHz of Lock Range for Microprocessors." IEEE Journal of Solid–State Circuits, pp. 1599–1607, vol. 27, No. 11, Nov. 1992.
Jacob Millman, Ph.D., "Microelectronics Digital and Analog Circuits and Systems" 630–631 McGraw–Hill (1979).
Paul R. Gray & Robert G. Meyer, "Analysis and Design of Analog Integrated Circuits" 604–632 John Wiley & Sons (1984).
Phillip E. Allen & Douglas Holberg, "CMOS Analog Circuit Design" 349–357 Saunders Hall Publishing (1987).

*Primary Examiner*—Robert Pascal
*Assistant Examiner*—Arnold Kinkead
*Attorney, Agent, or Firm*—Haverstock & Associates

[57] ABSTRACT

A differential amplifier or delay cell for use in a voltage controlled oscillator comprises a pair of clipper transistors coupled across the output nodes of the amplifier for limiting the voltage swing of the output to a transistor threshold and improving the frequency response of the amplifier. A cross-coupled pair of transistors are included to provide a hysteresis response further improving the noise immunity of the amplifier. A variable control voltage is converted to a current and used to control the frequency of the output signal. An oscillator is formed from three stages, cascaded together, each stage comprising the improved differential amplifier and controlled by a differential reference signal.

11 Claims, 15 Drawing Sheets

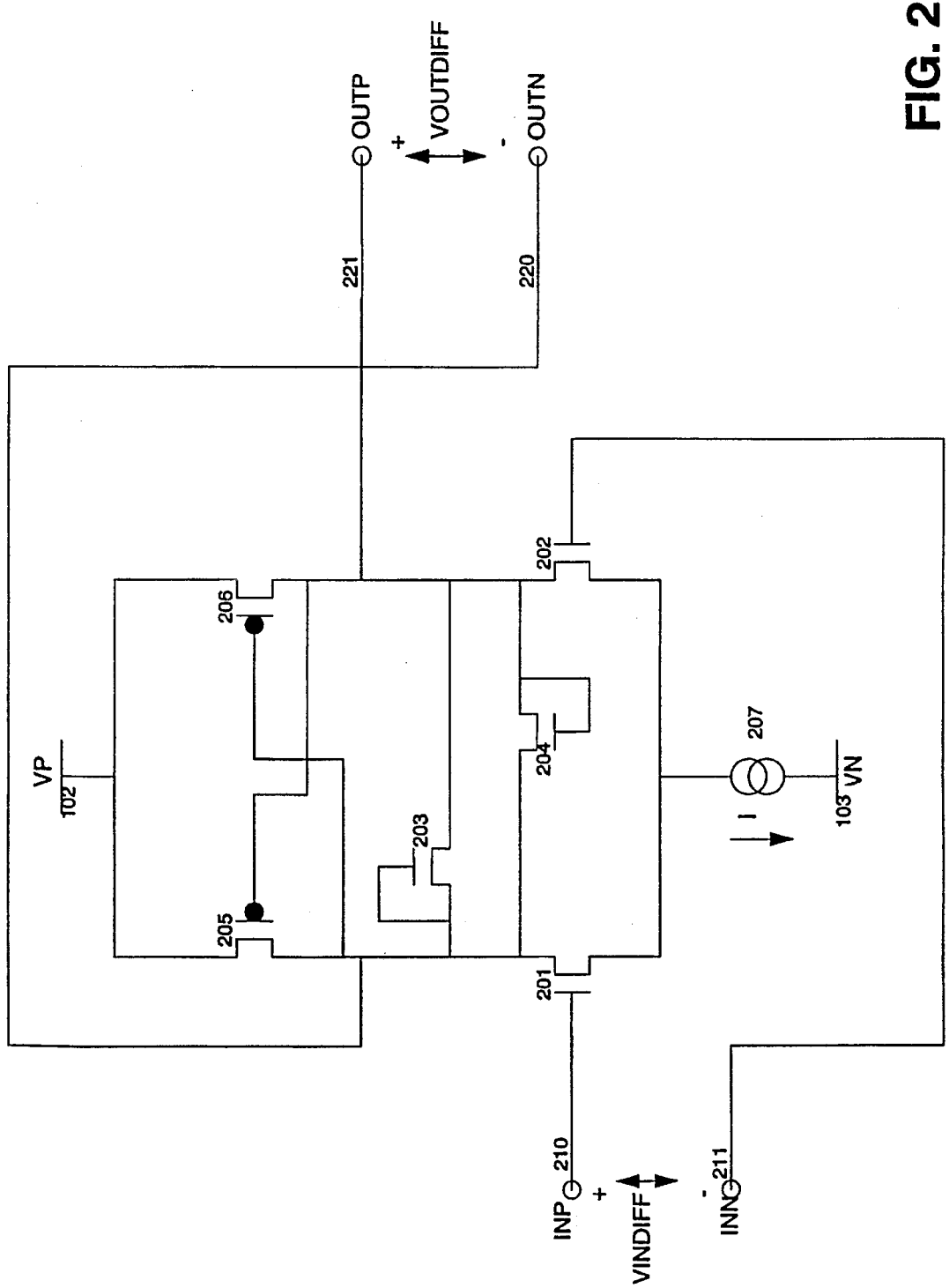

DIFFERENTIAL AMPLIFIER AND VARIABLE DELAY STAGE FOR USE IN A VOLTAGE CONTROLLED OSCILLATOR

This is a file wrapper continuation of application Ser. No. 08/169,158 filed on Dec. 17, 1993, now abandoned.

FIELD OF THE INVENTION

This invention relates generally to an integrated circuit design for voltage controlled oscillator circuitry pertaining to frequency synthesizers. More particularly, the present invention relates to differential amplifiers, variable delay cells or comparators used in ring oscillators. More specifically, the present invention relates to a variable delay cell for use in a voltage controlled oscillator within a phase locked loop.

BACKGROUND OF THE INVENTION

Oscillators produce a steady and stable, periodic time-varying output waveform which can serve as the information or timing signal for the signal-processing circuits. Early clock oscillators were developed using a series of odd inverter stages configured in a loop or a ring. Due to the inverters being single ended devices, they tended to have poor common mode rejection and swung from rail to rail and therefore the control of the frequency in such clock oscillators was difficult to achieve.

Quartz crystal oscillators were introduced in order to achieve a nearly constant oscillation frequency. These quartz oscillators required external components to an integrated circuit such as the quartz crystal and one or more capacitors placed on the printed circuit board. While a quartz crystal oscillator can generate an accurate constant frequency, multiple crystals of various frequencies must be combined to achieve multiple frequencies within a single circuit. In order to conserve space and decrease component count, it is desirable to generate multiple frequencies from a single oscillating source without multiple or external components.

Frequency synthesizers were introduced in order to achieve a desired range of frequencies and also minimize the required component count. Of present interest is a variable frequency oscillator circuit having a phase locked loop (PLL) with a voltage controlled oscillator (VCO) to properly maintain a desired frequency. An example of a PLL clock generator circuit is taught by Ian A. Young, Jeffrey K. Greason, and Keng I. Wong in "A PLL Clock Generator with 5 to 110 MHZ of Lock Range for Microprocessors." *IEEE Journal of Solid-State Circuits*, Vol. 27, No. 11, Nov. 1992. A charge pump and loop filter are used to generate a control voltage to either increase or decrease the frequency of the VCO, as illustrated in FIG. 2 of the Young et al. article. The VCO is then followed by a divide-by-2 circuit for generating an accurate 50% duty cycle clock waveform.

The VCO taught by Young et al. is based on a five stage ring oscillator. Each stage of this VCO is a current-controlled differential delay cell which includes a pair of source-coupled voltage-controlled resistors as load elements. This circuit utilizes a replica biasing cell to control both the current in each stage and the voltage controlled resistors. The control voltage is converted to a current signal and then applied to each of the five stages to achieve the desired frequency. A reference voltage and a control signal are used by the replica biasing cell to control the voltage-controlled resistors and hold the signal amplitude constant.

The clock generator taught by Young et al. is sensitive to common mode noise at the output VCR of the operational amplifier as illustrated in FIG. 2 of the Young et al. article. The output voltage VCR is used as the control voltage to control the variable resistors Rvcr. Any distortion or noise in the control voltage VCR will change the time constant of the delay stages to effect the frequency and period of the VCO.

When a high frequency output is desired, using the Young et al. clock generator, there are also problems associated with the gain margin. To obtain a high frequency oscillation, fewer stages in the oscillator and a small time constant ($\tau$=RC) are desired. To obtain oscillation for an inverter chain, a 180 degree phase shift and a voltage gain greater than one must be achieved. To obtain the proper phase margin, additional stages of the inverter are required for the inverter chain. To obtain the proper gain margin, either the gain of each inverter stage must be large or additional cascaded inverter stages are required. The capacitance value C, used to calculate the time constant, is dominated by the gate capacitance of the input transistors. The resistance value R, used to calculate the time constant, is equivalent to the variable resistance value Rvcr. The DC voltage gain Av of each delay stage is proportional to the value Rvcr*gm, where the value gm is equal to the transconductance of the input gate, which is proportional to the size of the transistor. For a fixed, minimum length L of the transistor, the DC voltage gain Av is proportional to the time constant value, Rvcr*C. Because the gain is proportional to the time constant value in the Young et al. clock generator circuit, the requirement of high gain and a small time constant are difficult to meet at the same time.

The jitter of an oscillator is a quantity used to express the quality of the oscillator's output signal. An output signal waveform has no jitter if its period is constant and does not vary over time. If an oscillator's output signal waveform has jitter, its period will vary over time and the edges or transition points of the waveform will correspondingly vary over time.

Another quantity of concern when discussing PLL oscillators is the power supply rejection ratio or how well the circuit rejects noise which is inherent to the power supply. Power supply noise comes from cycle-to-cycle switching of large-capacitance nodes within the chip and a second component which comes from the variation of circuit activity within the chip. This power supply noise can directly change the output frequency and phase of the oscillator. For example, if the power supply noise is large enough and occurs near a transition point, the output signal can contain spurious transition points caused by this noise from the power supply. Therefore it is very important that an oscillator have a high power supply rejection ratio (PSRR) in order to preserve the desired output waveform and reduce the effects of power supply noise.

A complementary metal oxide semiconductor (CMOS) linear comparator of the prior art is illustrated in FIG. 1A. The transistor 110 is an N-type field effect transistor (NFET) and includes a gate 120 which is coupled to the input INP. The gate 121 of the NFET 111 is coupled to the input INN. The output voltage level VOUT, which is measured between the node OUTP 101 and ground, is generated in response to the polarity of the voltage difference VIN between the two inputs INP and INN. The current I which flows through the current source 115 into the negative voltage supply VN 103 is a constant. The load transistors 112 and 113 are connected to the positive supply voltage VP 102.

A second comparator of the prior art which is nonlinear is illustrated in FIG. 1B. The transistors 110 and 111 are NFETs and the gates of each of the transistors 110 and 111 are coupled to the differential input VIN. The source of the transistor 110 is coupled to the source of the transistor 111 and to the current source 115. The drain of the transistor 110 is coupled to the drain of the transistor 130, to the gate of the transistor 131, and to the gate and drain of the transistor 133. The drain of the transistor 111 is coupled to the drain of the transistor 131, to the gate of the transistor 130, and to the gate and drain of the transistor 132. The sources of the transistors 130, 131, 132 and 133 are all coupled to the positive power supply voltage VP. The differential output voltage VOUT, which is measured between the drains of the transistors 130 and 131 is generated in response to the polarity of the input voltage difference VIN. The current I which flows through the current source 115 is a constant.

The cross-coupling of the gates of the transistors 130 and 131 in the comparator of FIG. 1B adds hysteresis characteristics to the circuit. Hysteresis is used to combat noise which is introduced to the circuit. Hysteresis is the quality of the comparator in which the input threshold changes as a function of the input or output level. Specifically, when the input level passes the first threshold or trip point, the output changes and the input threshold or trip point is subsequently reduced so that the input must return beyond the first threshold before the comparator's output will change states again.

As an example, consider that the gate 121 of the transistor 111 is tied to ground and the gate 120 of the transistor 110 is much greater than zero volts, causing the transistor 110 to turn on and the transistor 111 to turn off, thus turning on the transistors 131 and 133 and turning off the transistors 130 and 132. The current I will flow through the transistors 110, 130 and 133, causing the positive side OUTP of the output voltage VOUT to be at a high voltage level. Assume the input voltage INP changes direction, i.e. from a positive level towards a negative level, as the input voltage VIN decreases toward the threshold or trip point, the current through the transistor 110 decreases and some of the tail current I begins to flow through the transistor 111. This will continue until the point where the current through the transistor 111 equals the current through the transistor 131. Just beyond this point, the comparator output VOUT switches states so that the positive side of the output voltage VOUT is at a low voltage level. Once the threshold is reached and the comparator output changes state, the majority of the tail current I will flow through the transistors 111, 131 and 132 and the transistor 130 turns on and the transistors 110, 131, and 133 are turned off. Assuming the input voltage changes direction once again, the input voltage starts to increase above zero volts, the circuit reaches a point at which the current in the transistor 110 increases until it equals the current in the transistor 130. The input voltage at this point is the second threshold or trip point.

A disadvantage to the comparators of FIGS. 1A and 1B is that on a transition point, the output voltage swings close to the range from rail to rail, or from the positive supply voltage VP to the negative supply voltage VN. Therefore, the frequency of these comparators is directly limited by the time that it takes the circuit to switch from one power supply voltage level to the other power supply voltage level. When the output voltage is nearly at the negative supply voltage VN level, it takes the comparator time to recover and swing the output voltage close to the positive power supply voltage VP level on a transition point.

What is needed is an improved comparator or differential amplifier, which has improved jitter and power supply rejection ratio characteristics. What is further needed is an improved differential amplifier or variable delay cell for use in an oscillator which reduces or eliminates start up problems associated with oscillators of the prior art. What is also needed is an oscillator with an improved frequency response because its output voltage does not have to swing from rail to rail. What is also needed is a VCO having a reduced number of stages in order to provide a higher maximum frequency of oscillation and a larger frequency range.

SUMMARY OF THE INVENTION

A differential amplifier or delay cell for use in a voltage controlled oscillator comprises a pair of clipper transistors coupled across the output nodes of the amplifier for limiting the voltage swing of the output to a transistor threshold and improving the frequency response of the amplifier. A cross-coupled pair of transistors are included to provide a hysteresis response further improving the noise immunity of the amplifier. A variable control voltage is converted to a current and used to control the frequency of the output signal. An oscillator is formed from three stages, cascaded together, each stage comprising the improved differential amplifier and controlled by a differential reference signal.

BRIEF DESCRIPTION OF THE DRAWINGS

FIG. 2A illustrates a transistor schematic of a comparator of the present invention, using N-type transistors for the clipper transistors.

DETAILED DESCRIPTION OF THE PREFERRED EMBODIMENT

Figure 1A:
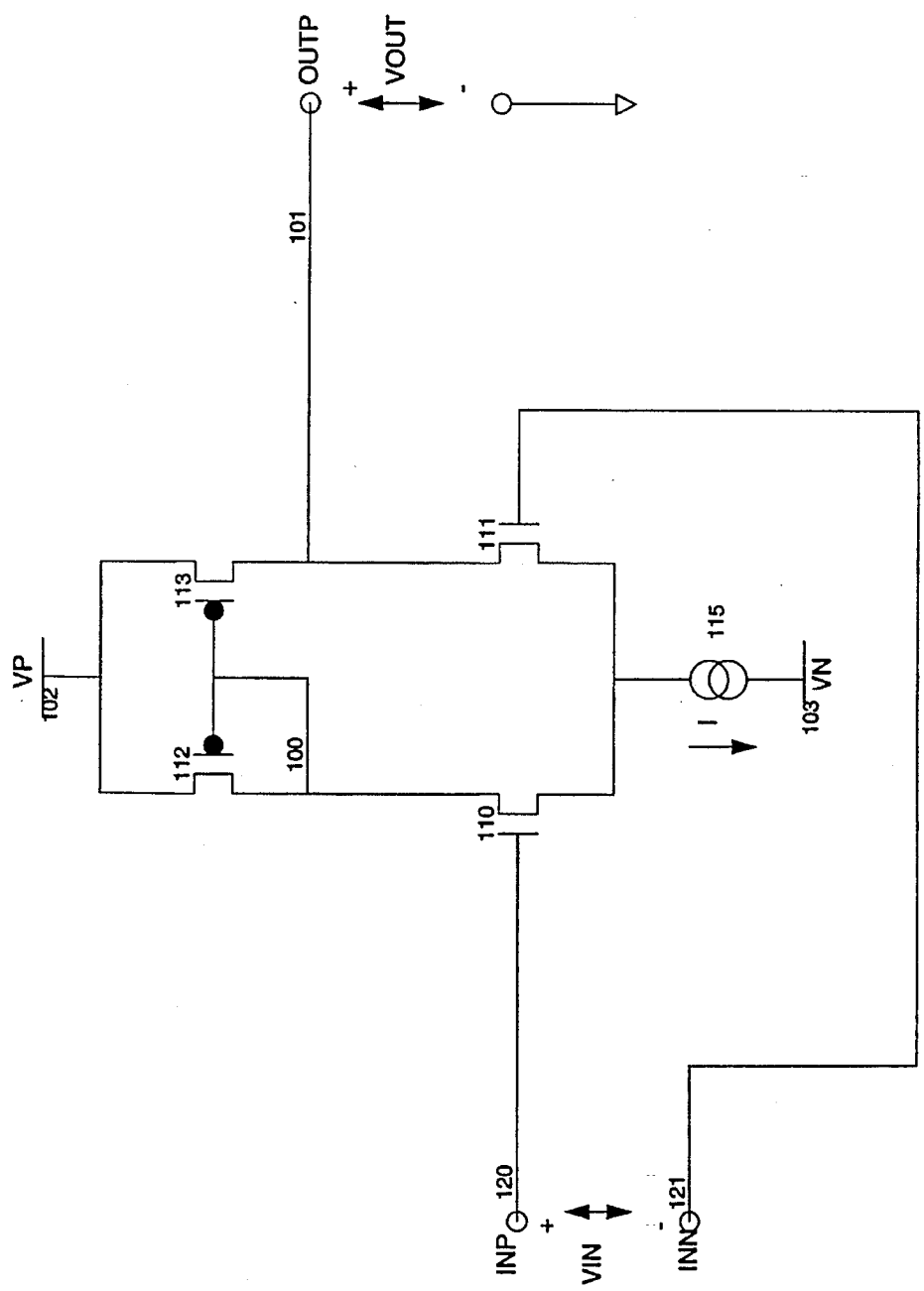
FIGS. 1A and 1B illustrate transistor schematics of prior art comparators.
Figure 1B:
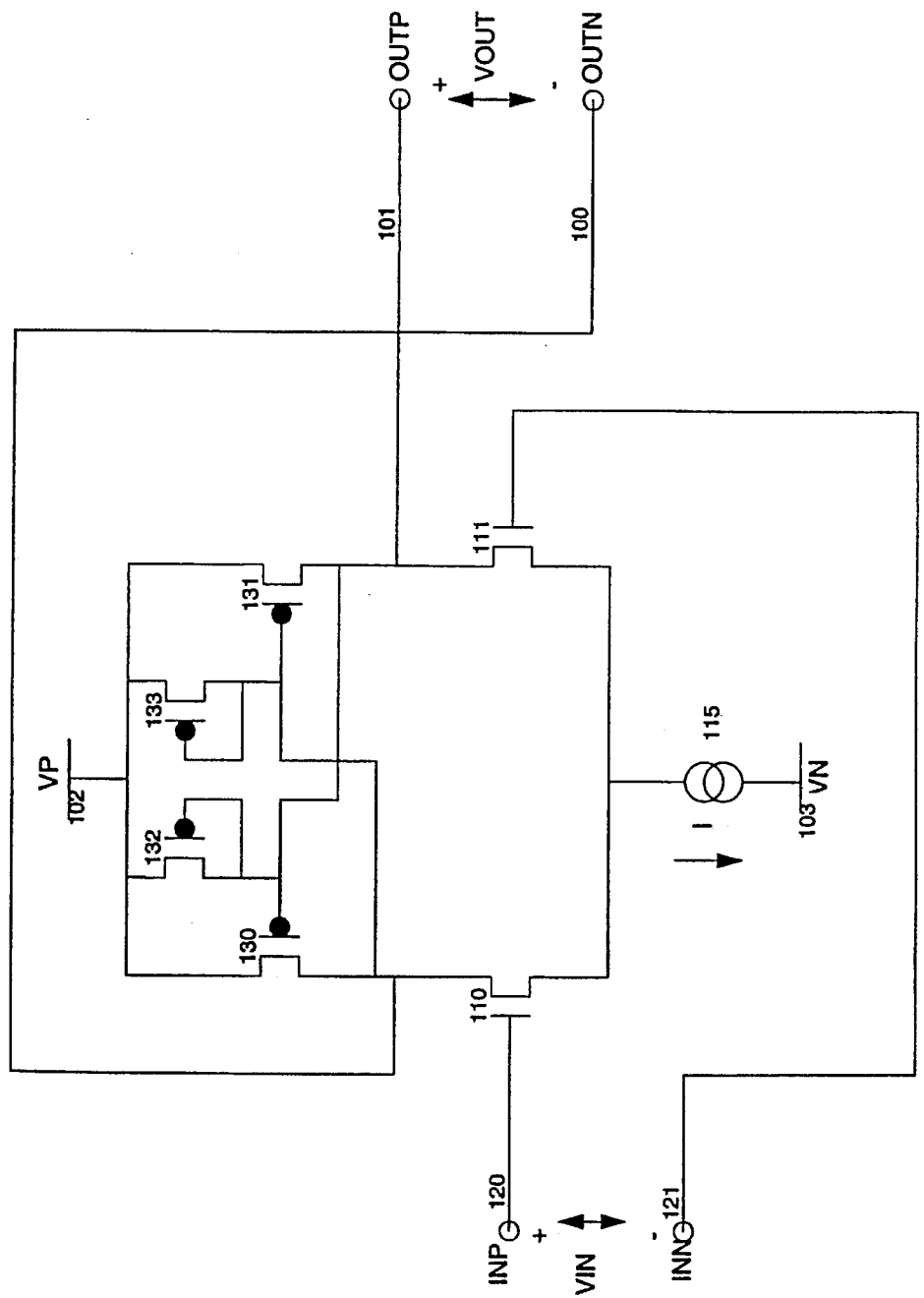

A comparator of the present invention is illustrated in FIG. 2A. The differential input signal is coupled to the gates of the input N-channel MOS transistors 201 and 202. The source of the transistor 201 is coupled to the source of the transistor 202 and to a first terminal of the current source 207. The second terminal of the current source 207 is coupled to the negative voltage supply VN. The drain of the transistor 201 is coupled to the source of the transistor 204, the drain and gate of the transistor 203, the drain of the P-channel MOS transistor 205 and the gate of the p-channel MOS transistor 206. The drain of the transistor 202 is coupled to the drain and gate of the transistor 204, the source of the transistor 203, the drain of the transistor 206 and the gate of the transistor 205. The source of the transistor 205 is coupled to the source of the transistor 206 and the positive voltage supply VP. The differential output signal is measured between the negative output node OUTN 220 and the positive output node OUTP 221. The current I which flows through the current source 207 is a constant.

The clipper transistors 203 and 204 are coupled in a diode fashion having an opposite polarity relative to one another between the differential output nodes OUTN and OUTP to limit the voltage difference which appears between the output nodes OUTP and OUTN to one NFET threshold, or approximately 1.2 volts, of one another. Therefore, during transitions, the output nodes OUTN and OUTP do not swing close to rail to rail from the positive power voltage supply VP value to the negative voltage supply VN value or vice versa. By limiting the range which the output nodes OUTP and OUTN can swing, the frequency response of this differential amplifier is improved over the differential amplifiers of the prior art. Instead of waiting for the output node voltage to swing from rail to rail as taught by the prior art, the differential amplifier illustrated in FIG. 2A, limits the range of output voltage that the output nodes must swing to approximately plus or minus 1.2 volts from one another. For example, in FIG. 2A, the output OUTN 220 would swing from 1.9 volts up to 3.1 volts while the output OUTP 221 would swing from 3.1 volts down to 1.9 volts in response to the differential input signal VINDIFF going from a positive value to a negative value, as when the input INP swings from 3.1 volts down to 1.9 volts and the input INN swings from 1.9 volts up to 3.1 volts. By limiting the range of this voltage swing, the frequency range within which the differential amplifier of the present invention can operate is increased.

The transistors 205 and 206 are cross-coupled to provide the comparator with hysteresis characteristics and increase the power supply rejection ratio and noise immunity of the circuit. Hysteresis is the quality of the comparator in FIG. 2A in which the input switching threshold required to start changing the outputs of the comparator has a first and a second level. When the differential input signal VINDIFF swings from a negative value to a positive value, the differential outputs transition when the differential input signal VINDIFF pass through the first level of the input switching threshold. When the differential input signal VINDIFF swings from a positive value to a negative value, the outputs transition when the differential input signal VINDIFF passes through the second level of the input switching threshold. For example, the first level for the input switching threshold may be at positive 200 millivolts and the second level for the input switching threshold may be at negative 200 millivolts.

Figure 2B:
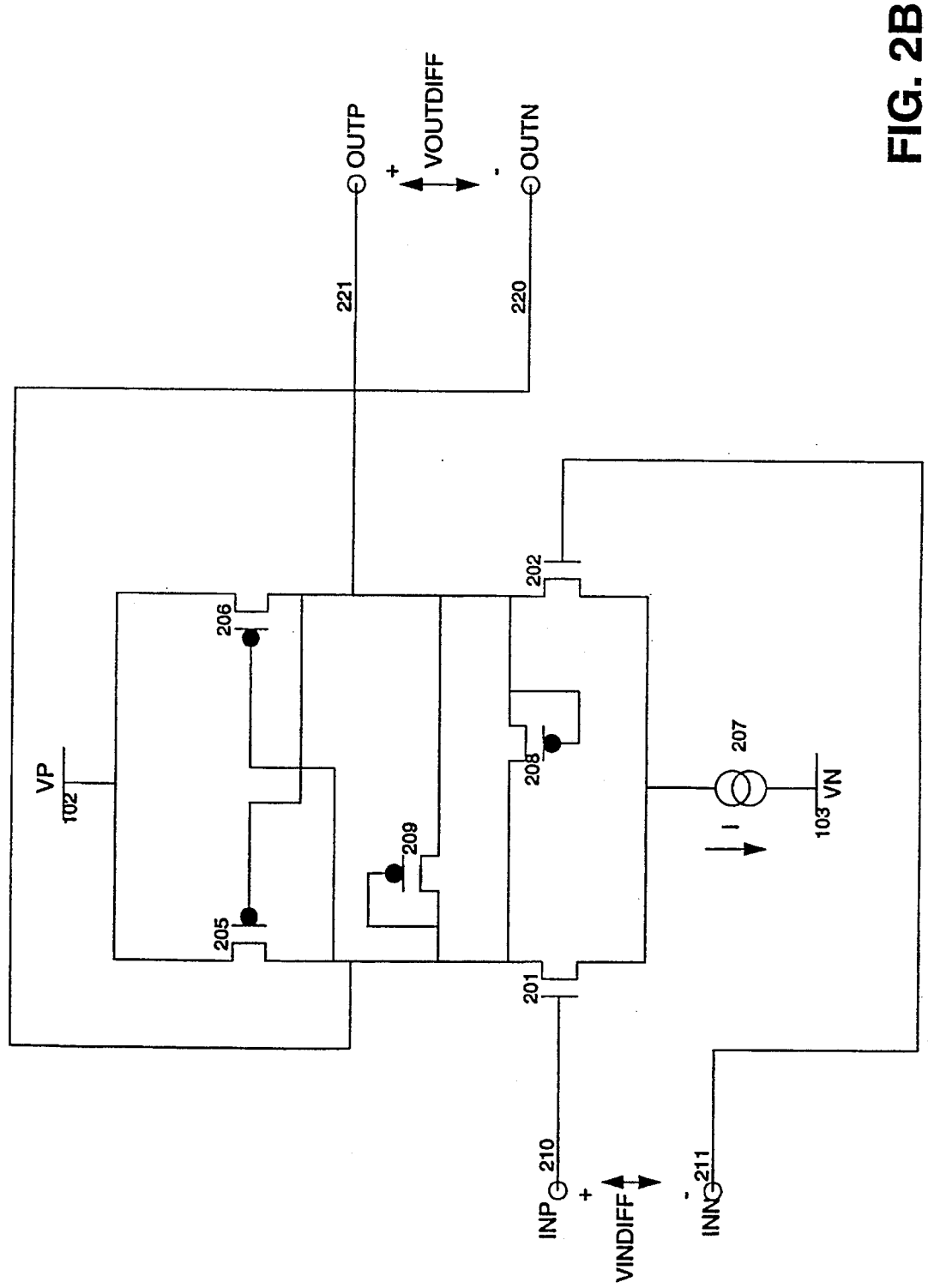
FIG. 2B illustrates an alternate embodiment of the comparator of the present invention, using P-type transistors for the clipper transistors.
Figure 3A:
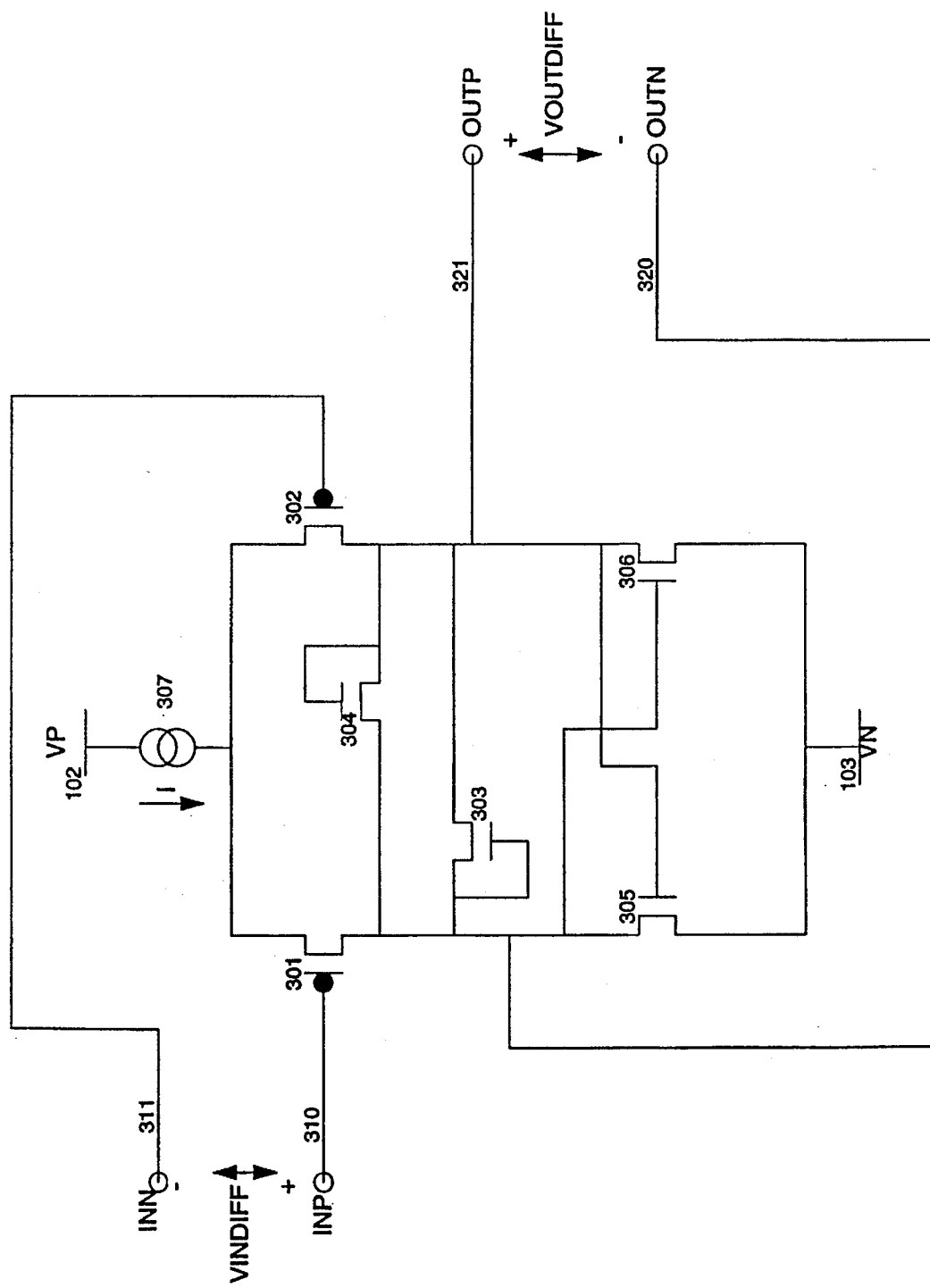
FIG. 3A illustrates a transistor schematic of an alternate embodiment of the comparator of the present invention, using N-type transistors for the clipper transistors.
Figure 3B:
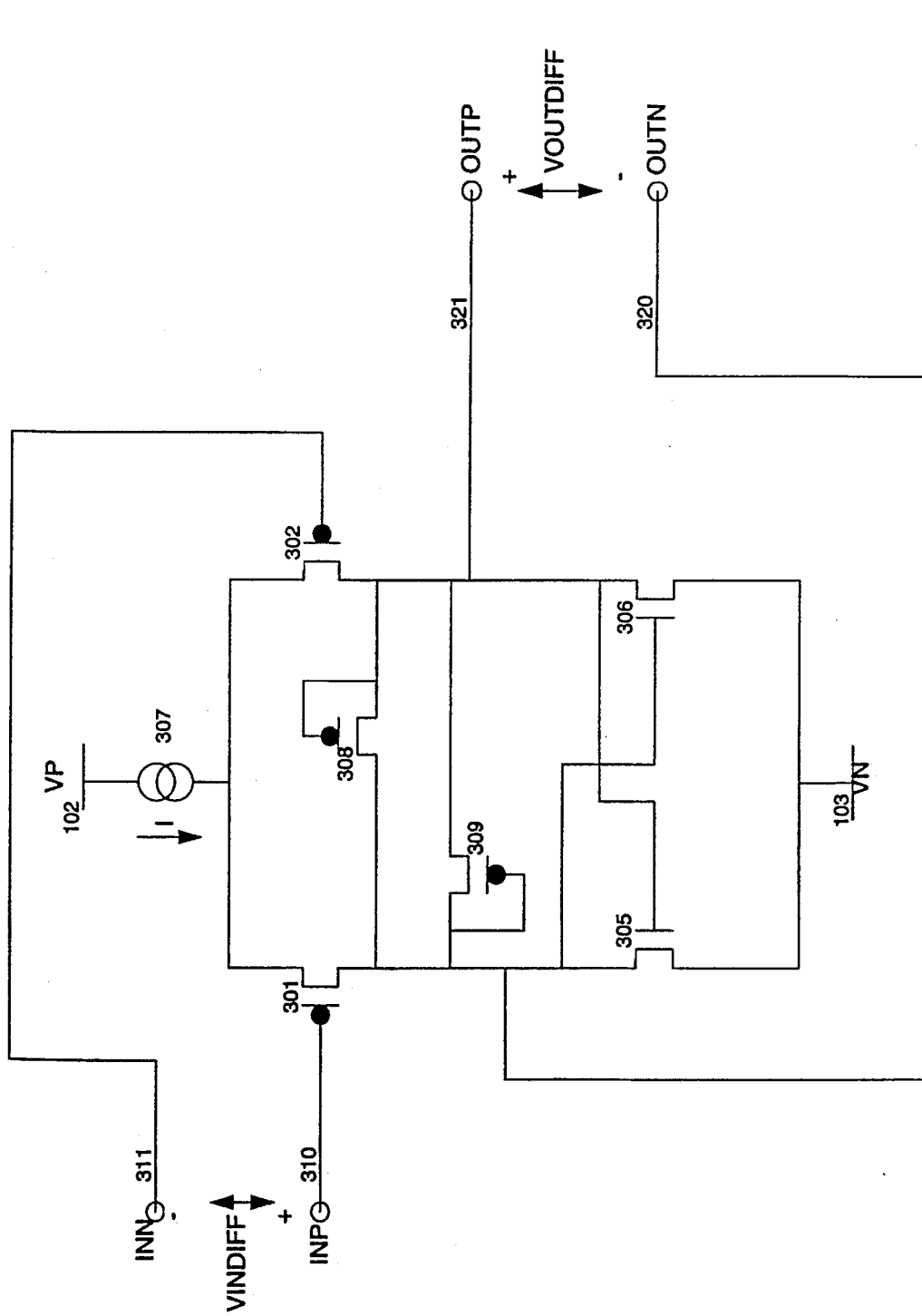
FIG. 3B illustrates a transistor schematic of an alternate embodiment of the comparator of the present invention, using P-type transistors for the clipper transistors.

Am alternate embodiment of the comparator is illustrated in FIG. 2B. In particular, the clipper transistors 203 and 204 are P-type transistors instead of N-type transistors. Other alternate embodiments of the comparator are illustrated in FIGS. 3A and 3B. The comparator illustrated in FIGS. 3A and 3B includes the constant current source 307 coupled to the positive voltage supply VP 102 and the cross-coupled N-channel MOS transistors 305 and 306, providing hysteresis, are coupled to the negative voltage supply VN. The transistors 301 and 302 are P-channel MOS transistors which are coupled between the current supply 307 and the cross-coupled load transistors 305 and 306. The clipper transistors 303 and 304 are N-type transistors in FIG. 3A and the clipper transistors 308 and 309 are P-type transistors in FIG. 3B.

Figure 4:
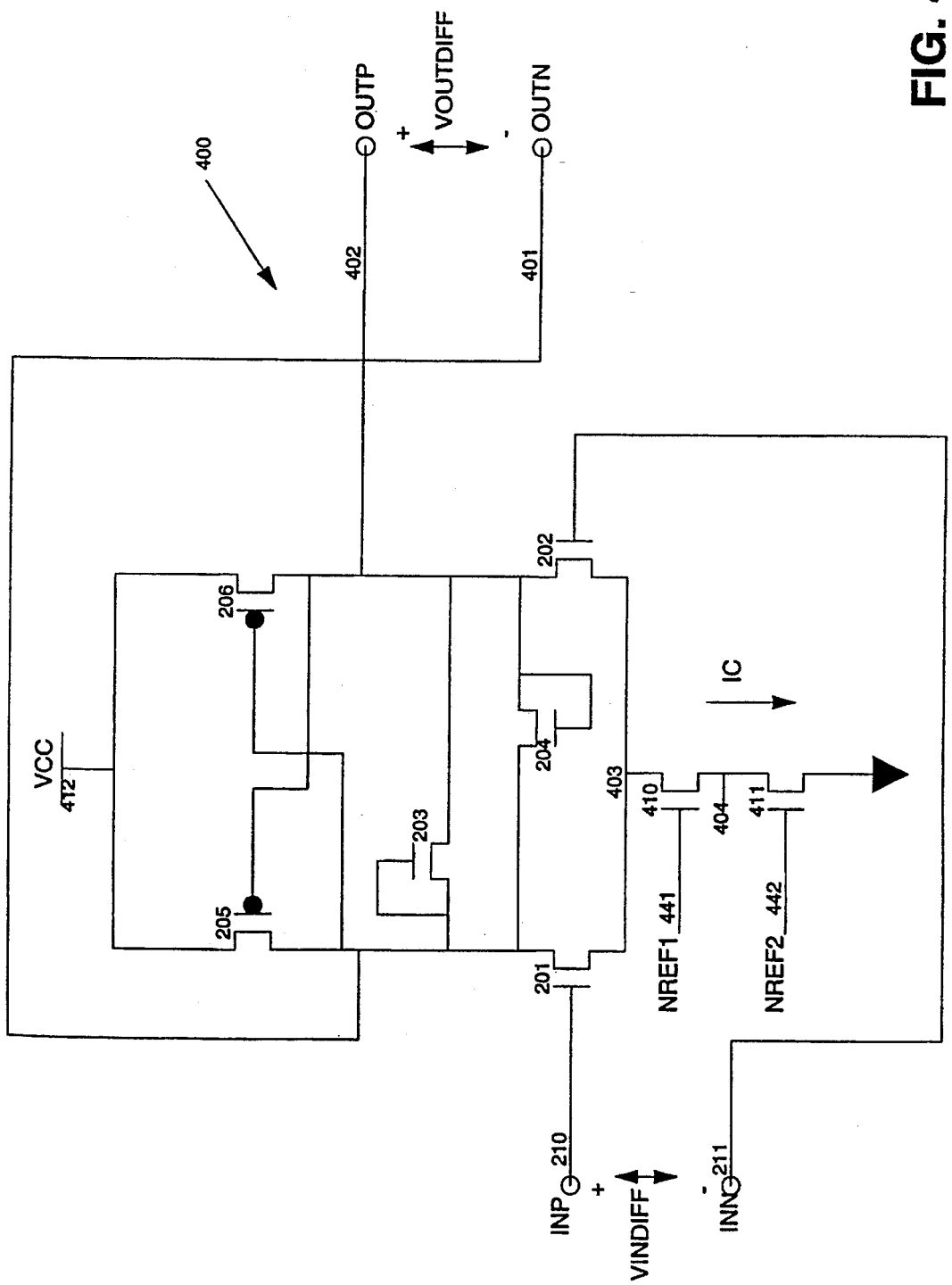
FIG. 4 illustrates a transistor schematic of the preferred embodiment of the variable gain improved differential amplifier of the present invention for use within an oscillator circuit.

FIG. 4 illustrates a schematic diagram of the preferred embodiment non-linear variable gain differential amplifier of the present invention for use within a voltage controlled oscillator circuit. The differential amplifier of FIG. 4 is nearly equivalent to the differential amplifier illustrated in FIG. 2A except that the constant current source 207 is now replaced with the current tail transistors 410 and 411. These current tail transistors in conjunction with other transistor components described below provide a variable current source in response to a control voltage in order to adjust the gain of the differential amplifier to change the frequency of oscillations of the overall voltage controlled oscillator. In order to adjust the gain and control the frequency of oscillations, the transistors 410 and 411 are controlled by the signals NREF1 441 and NREF2 442.

To avoid the difficulties associated with the circuits of the prior art, as discussed previously, the time constant value for the differential amplifier of FIG. 4 is controlled by the tail current IC only, as will be explained below, eliminating the need for an operational amplifier and the variable resistors used in the circuits of the prior art. The clipper transistors 203 and 204 are included to control the common mode output voltage of the differential amplifier of FIG. 4, linearize the relationship between the variable control current IC and the frequency of the output waveform, and increase the maximum oscillating frequency by limiting the swing as described above.

The differential amplifier of FIG. 4 also includes hysteresis characteristics because of the positive feedback introduced by the negative transconductance gm of the cross-coupled loading transistors 205 and 206. The DC voltage gain Av of the amplifier at the transient point is infinite.

Figure 5:
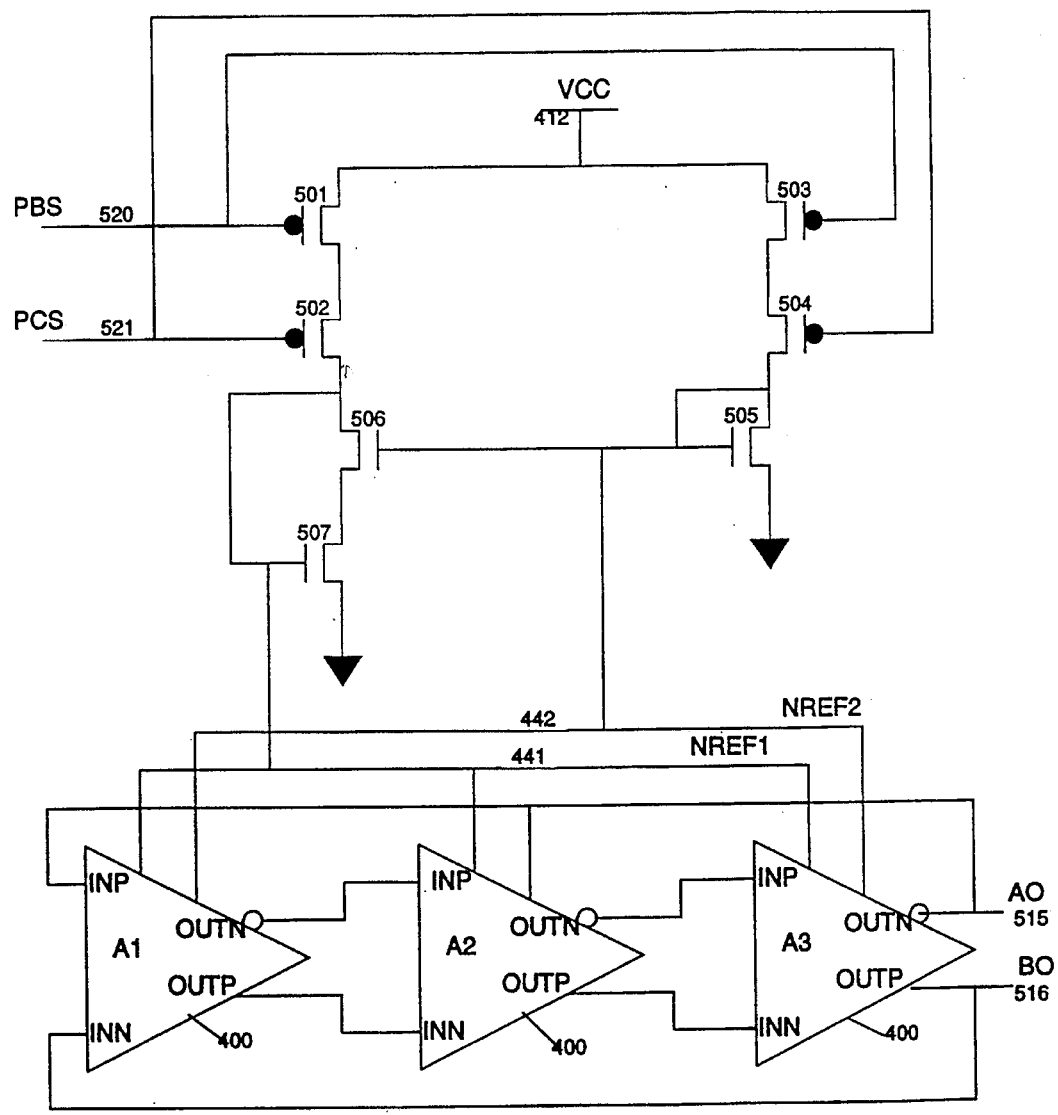
FIG. 5 illustrates a schematic diagram of a three-stage voltage controlled oscillator containing the improved differential amplifier of the present invention within each stage.
Figure 10:
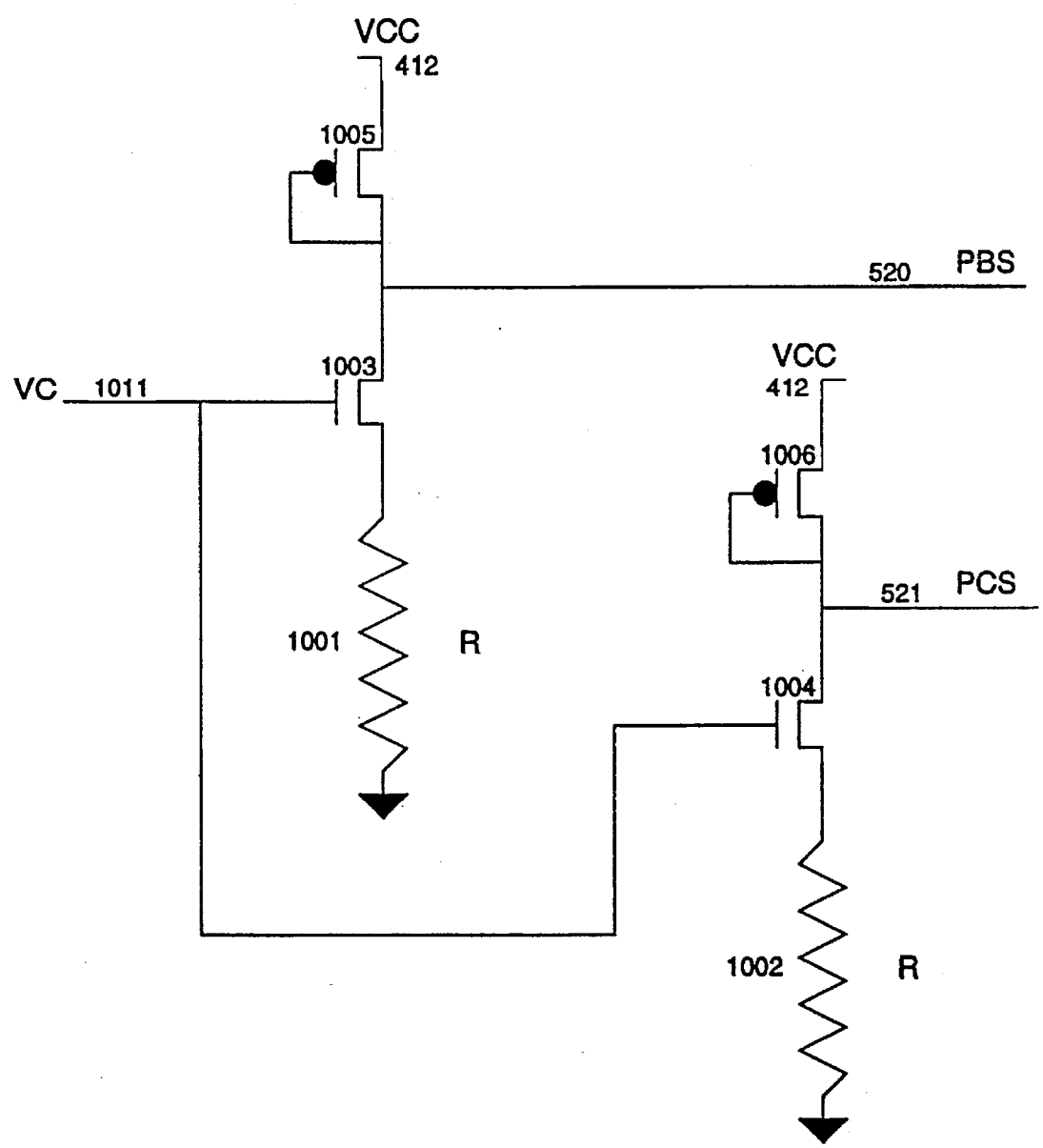
FIG. 10 illustrates a circuit used to convert the control voltage to the control current input.

FIG. 5 illustrates a schematic diagram of a three-stage cascaded voltage controlled oscillator containing the improved differential amplifier illustrated in FIG. 4. Each one of the amplifier stages A1, A2 and A3 comprises an improved differential amplifier as illustrated in FIG. 4. FIG. 10 illustrates the first circuit portion of the variable current source for each improved differential stage. The variable control voltage signal VC 1011 is coupled to the gates of the transistors 1003 and 1004. The source of the transistor 1005 is coupled to the positive voltage supply VCC. The drain of the transistor 1005 is coupled to the drain of the transistor 1003. The source of the transistor 1003 is coupled to a first terminal of the resistor 1001. The second terminal of the resistor 1001 is coupled to ground. The source of the transistor 1006 is coupled to the positive voltage supply VCC. The drain of the transistor 1006 is coupled to the drain of the transistor 1004. The source of the transistor 1004 is coupled to the first terminal of the resistor 1002. The second terminal of the resistor 1002 is coupled to ground. The preliminary bias voltage signal PBS 520 is coupled to the gate and drain of the transistor 1005. The preliminary bias voltage PCS 521 is coupled to the gate and drain of the transistor 1006.

The control voltage input signal VC 1011, a variable voltage, is applied to the gates of the transistors 1003 and 1004. The transistors 1003 and 1004 function as variable resistors controlling the amount of current flowing into the resistors 1001 and 1002. The current flowing through the resistors 1001 and 1002 is effectively mirrored into the current tail transistors 410 and 411 of each differential stage of the VCO, through a second circuit portion of the current source. The current flowing through the resistors 1001 and 1002 varies the preliminary bias voltages PBS 520 and PCS 521. The preliminary bias voltage PBS 520 is coupled to the gates of the P-type transistors 501 and 503 of FIG. 5. The preliminary bias voltage PCS 521 is coupled to the gates of the P-type transistors 502 and 504.

The second circuit portion of the variable current source is comprised of the transistors 501–507, illustrated in FIG. 5. The second circuit portion generates the final variable bias voltages NREF1 and NREF2 that are coupled to the gates of the transistors 410 and 411 of each differential amplifier stage of the VCO. The variable bias voltage is proportional to the amount of current flowing through the resistors 1001 and 1002. The variable bias voltage is converted to current that will flow through each differential amplifier stage by the transistors 410 and 411 of each individual stage. This current is proportional to the current flowing through the resistors 1001 and 1002, established by the variable control voltage VC 1011.

In FIG. 5, the signals NREF1 441 and NREF2 442 are coupled to each stage of the oscillator to control the frequency of the output waveform measured from the output node AO 515 or BO 516. The signal PBS 520 is coupled to the gate of each of the p-type transistors 501 and 503. The signal PCS 521 is coupled to the gate of each of the p-type transistors 502 and 504. The source of the transistor 501 is coupled to the source of the transistor 503 and to the positive voltage supply VCC. The drain of the transistor 501 is coupled to the source of the transistor 502. The drain of the transistor 503 is coupled to the source of the transistor 504.

The drain of the transistor 502 is coupled to the drain of the transistor 506, to the gate of the transistor 507 and as the NREF1 441 control input to each of the three stages A1, A2 and A3. The drain of the transistor 504 is coupled to the drain of the transistor 505, to the gates of the transistors 505 and 506 and as the NREF2 control input 442 to each of the three stages A1, A2 and A3. The source of both of the transistors 505 and 507 is coupled to ground.

The differential output of the first stage A1 is coupled as the differential input of the second stage A2. The differential output of the second stage A2 is coupled as the differential input of the third stage A3. The differential output of the third stage A3 is coupled to the output nodes AO and BO and as the differential input to the first stage A1. For the three stage VCO as illustrated in FIG. 5, the OUTN signal of each stage feeds into the INP signal of the next stage and the OUTP signal of each stage feeds into the INN signal of the next stage.

Figure 6:
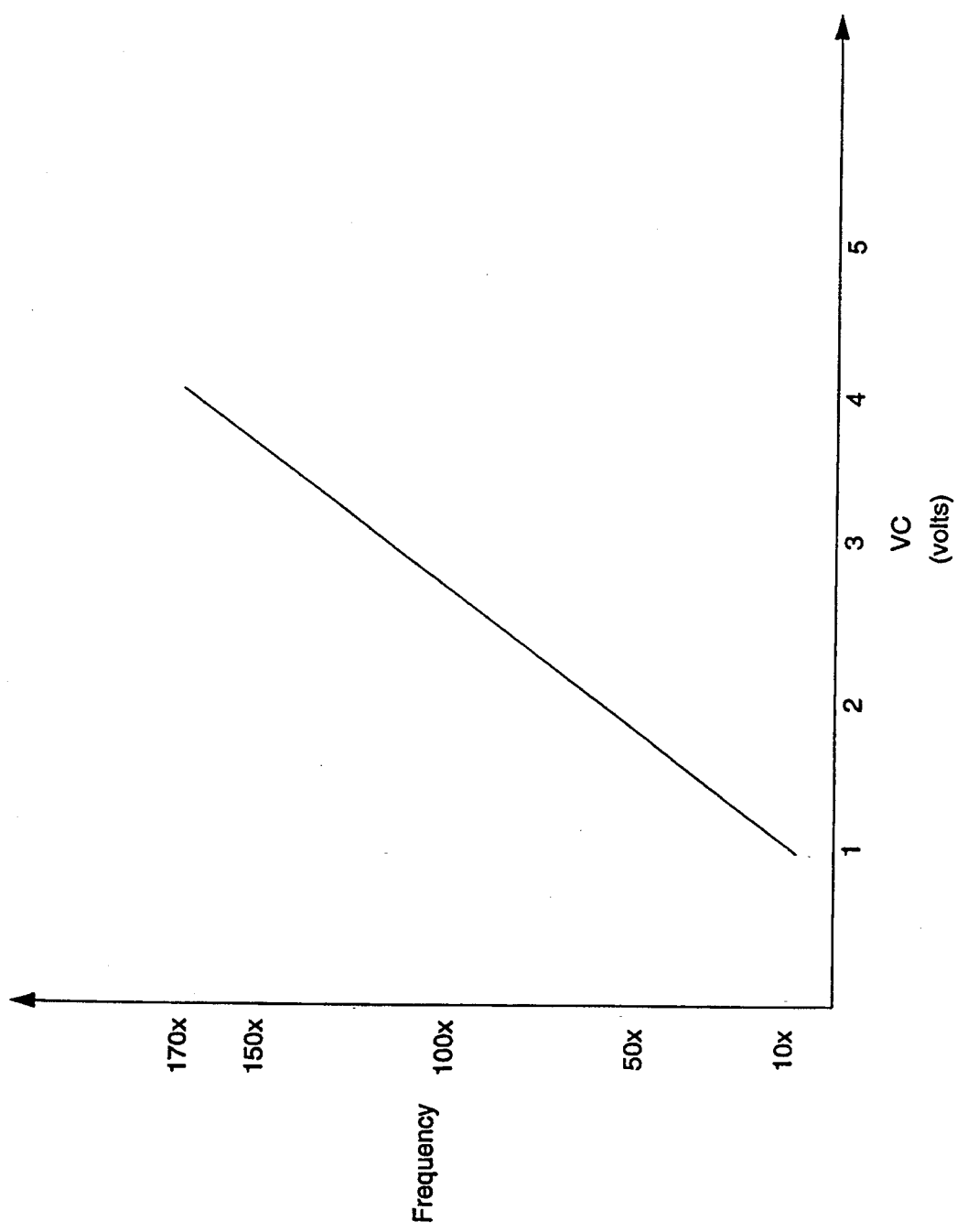
FIG. 6 illustrates a simulated plot showing the linearity of the oscillator of FIG. 5 for various frequency ranges over the range of variable current inputs.

FIG. 6 illustrates a plot showing the linearity of the oscillator's output frequency in response to the control voltage VC 1011. The control voltage VC is illustrated along the x-axis and the frequency response is illustrated along the y-axis of the graph of FIG. 6. As can be seen in FIG. 6, there is a linear relationship between the control voltage VC and the corresponding frequency response. If the control voltage VC is increased, the frequency response of the oscillator also increases by a proportional amount. The linear characteristics of the oscillator illustrated in FIG. 5 is important in helping to reduce the jitter of the output waveform.

It should be apparent to a person of ordinary skill in the art that the oscillator of FIG. 5 can be controlled by a control voltage or a control current. Accordingly, the circuit which is used to convert the control voltage VC to a control current I is illustrated in FIG. 10. As the control voltage VC is increased, the control current will correspondingly increase. To illustrate how VC varies the frequency of oscillation, the time constant $\tau$ of the output signal waveform of the differential amplifier can be expressed by the following equation:

$$\tau = RC \tag{1}$$

Assuming the voltage of the output OUTP is greater than the voltage of the output OUTN, the value of the output impedance R of equation (1) can be expressed by the following equation:

$$R = \frac{OUTP - OUTN}{I} \tag{2}$$

This value of the output impedance R can be substituted from the equation (2) into the equation (1) to illustrate that the time constant $\tau$ is inversely proportional to the current I as shown in the following equation:

$$\tau = \frac{(OUTP - OUTN)C}{I} \tag{3}$$

Because the time constant $\tau$ of the output waveform is inversely related to the frequency of the output waveform of the differential amplifier, the frequency of the output waveform is directly proportional to the current I. Therefore, by controlling the current I, the frequency of the output signal can be controlled.

Figure 7:
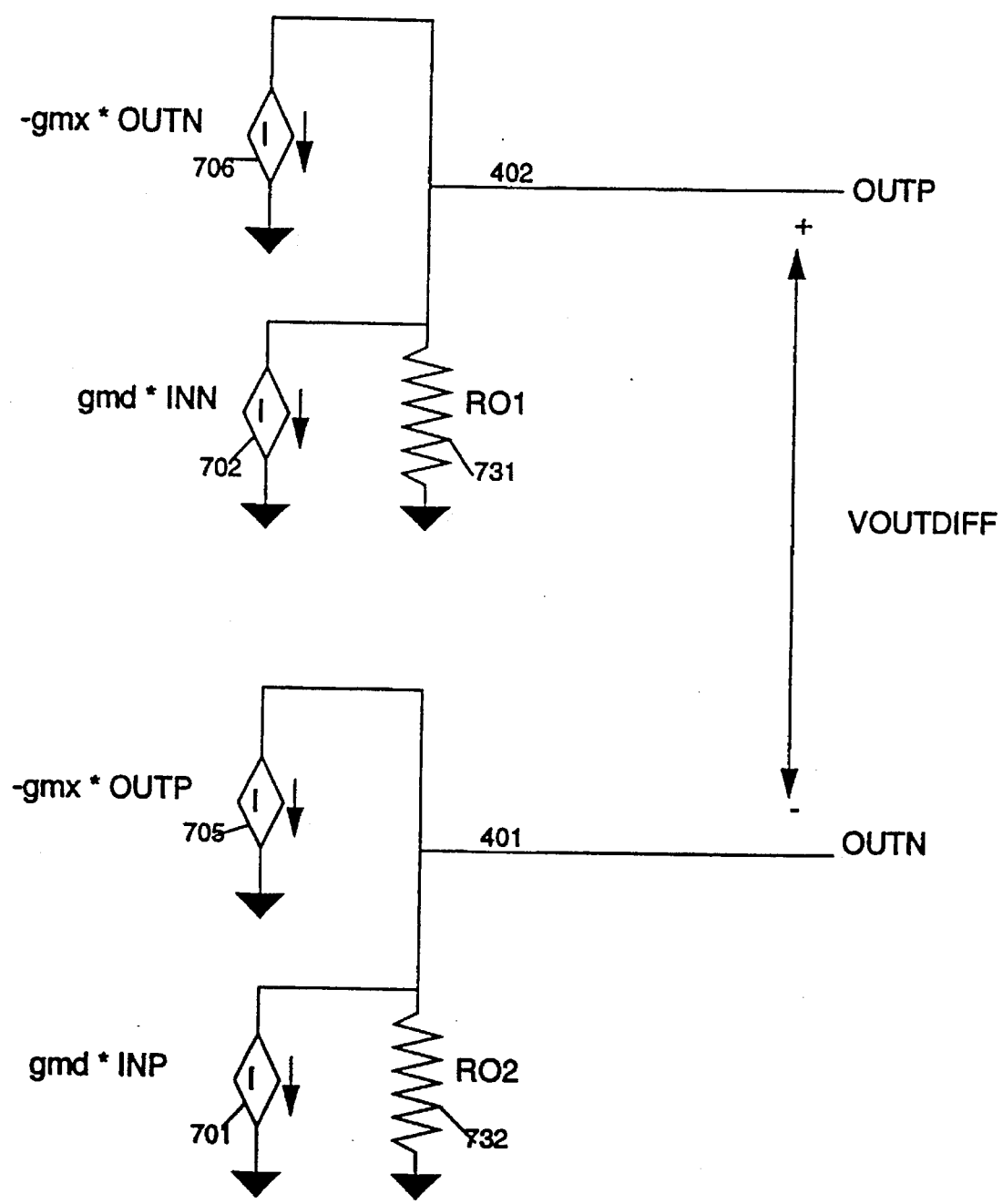
FIG. 7 illustrates a small-signal model of the improved differential amplifier of the present invention.

A small-signal model of the differential amplifier of FIG. 4 is illustrated in FIG. 7. From the output OUTN, the differential amplifier is modeled where the transistor 205 appears as a variable current source 705 having a current I equal to the value (–gmx*OUTP). The transistor 201 is modeled as a variable current source 701 having a current I equal to the value (gmd*INP). The other transistors of the differential amplifier, including the transistors 201, 203, 204, and 205 and the parasitic capacitances associated with all of the devices connected to the output OUTN are represented by the impedance RO2 732.

From the output OUTN, the differential amplifier is modeled where the transistor 206 appears as a variable current source 706 having a current I equal to the value (–gmx*OUTN). The transistor 202 is modeled as a variable current source 702 having a current I equal to the value (gmd*INN). As above, all of the devices and parasitic capacitances coupled to the output OUTP are modeled as the impedance RO1 731.

The gain value gmx is a function of the size of the transistors 205 and 206, their size being equivalent. The gain value gmd is a function of the size of the transistors 201 and 202, as well as the value of the variable voltage controlled current source provided through the current tail transistors 410 and 411 of FIG. 4. The size of the transistors 201 and 202 is also equivalent.

The value for the impedances RO1 and RO2 vary because of the voltage differences applied to the inputs INN and INP, as well as the variability in the current source. At the point where the inputs INN and INP are equal, the impedance values are nearly identical, representing the mirrored transistors of each side of the comparator. The transistors 206, 202 and 203 representing one side and the transistors 205, 201 and 204 representing the other side. The clipping transistors 203 and 204 do not greatly effect the gain of the differential amplifier.

The alternating current (ac) noise or common mode voltage VCOM is coupled from the power supply into the circuit through the transistors 205 and 206. It is coupled into the (VOUTDIFF) difference output signal OUTP-OUTN only to the extent that the impedance values RO1 and RO2 are different. The common mode noise is increased when the output voltages OUTP and OUTN are at the extreme limits of their range. When the output voltage OUTP is equal to the output voltage OUTN, the voltage difference output is zero and the impedance values RO1 and RO2 are nearly equal. Thus, the common mode noise source VCOM is practically eliminated because the value [gmx(RO1–RO2)*VCOM] is nearly equal to zero. For this reason, it is important to limit the variance of the impedances RO1 and RO2 to a narrow range. This can be accomplished by the clipper transistors 203 and 204, which keep the output voltages OUTN and OUTP from swinging over a wide range of voltages and thus confine the variance of the impedances RO1 and RO2 to a narrow range, thereby reducing the effects of the common mode noise source.

In the case of the differential hysteresis comparators of FIGS. 2 and 3, the current source 207 provides a constant current source instead of a variable current, but the same small signal model illustrated in FIG. 7, can apply to those circuits as well. However, the gain value gmd remains a constant and does not vary as a function of the control voltage input VC, as it would when modeling the variable gain differential amplifier of FIG. 4.

The differential voltage output OUTP-OUTN for the circuit of FIG. 7 is given by the following equation:

$$\text{OUTP} - \text{OUTN} = \frac{gmd(\text{INN}*RO1 - \text{INP}*RO2) - gmx(RO1 - RO2)*VCOM}{1 - \frac{gmx(RO1 + RO2)}{2}} \quad (4)$$

At the point where the denominator of the equation (4) equals zero, the gain of the differential amplifier is equal to infinity. This point is the threshold or trip point where the output voltages of the differential amplifier switch from a first voltage level to a second voltage level. The input voltage which causes a transition is also referred to as the differential input trip voltage. In this circuit, the trip voltage of the hysteresis can be controlled within 200 mV over the frequency range and can be calculated at the point where the value (1–gmx1*RO1)*(1–gmx2*RO2) is equal to zero. The values gmx1 and gmx2 represent the gain of the transistors 205 and 206, respectively. If the transistors 205 and 206 are equally sized and equally weighted the values gmx1 and gmx2 will be equal in value, represented by gmx in Equation 4.

Figure 9A:
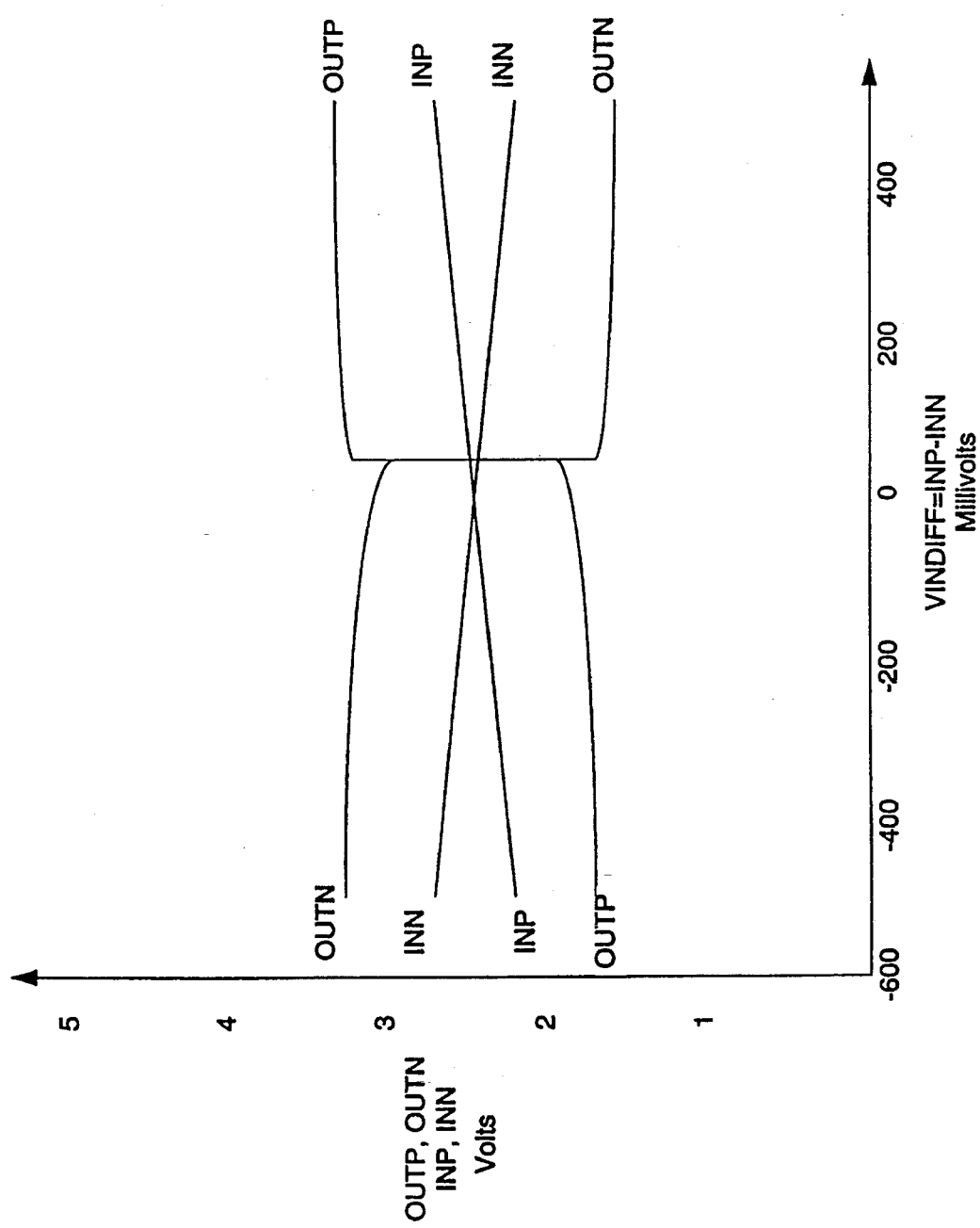
FIG. 9A illustrates a simulated plot showing the hysteresis effects of the differential amplifier of the present invention as the input voltage differential VINDIFF transitions from negative to positive.
Figure 9B:
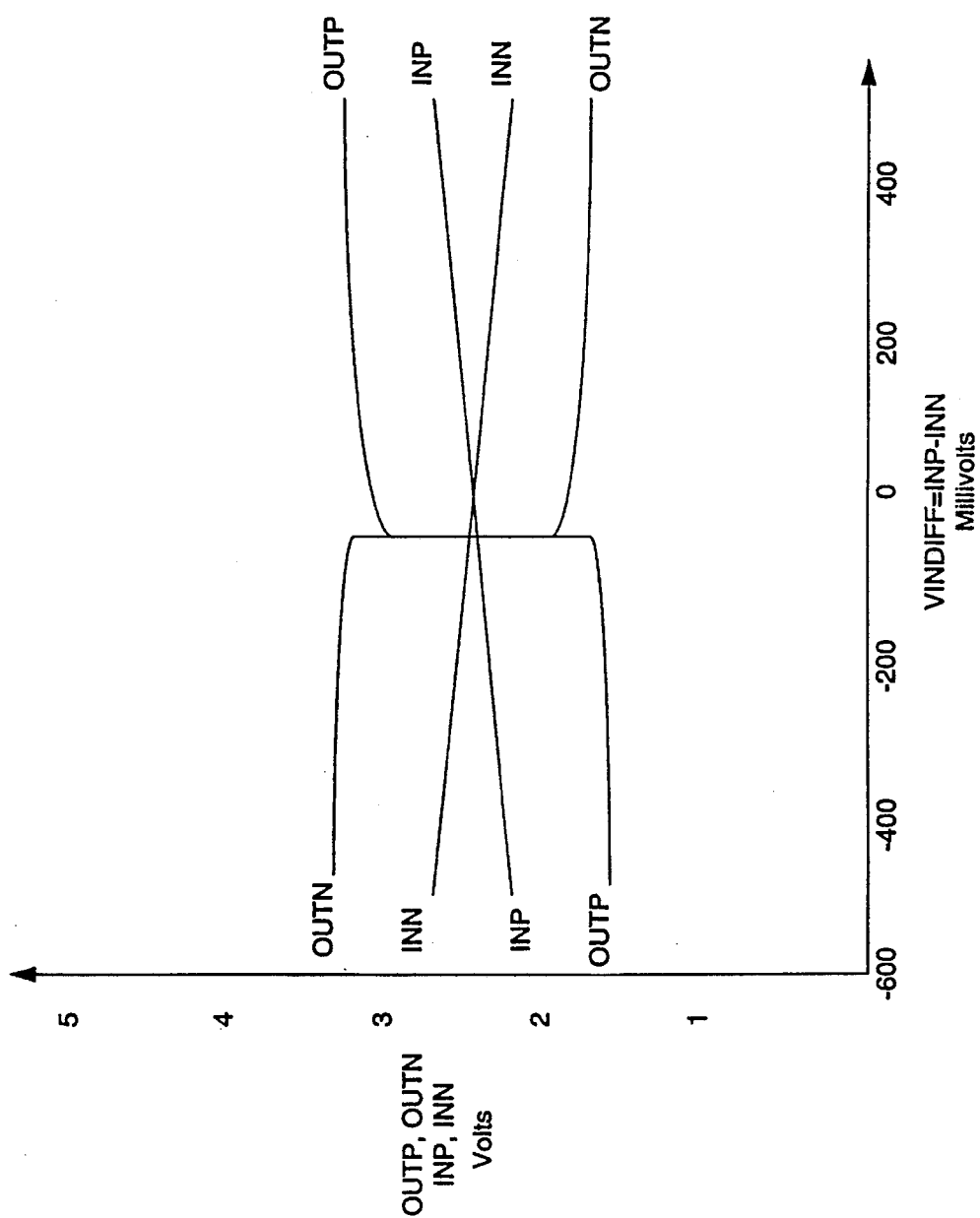
FIG. 9B illustrates a simulated plot showing the hysteresis effects of the differential amplifier of the present invention as the input voltage differential VINDIFF transitions from positive to negative.

FIG. 9A illustrates a simulated plot showing the hysteresis effects of the differential amplifier of the present invention as illustrated in FIG. 4, as the inputs transition from negative to positive. FIG. 9B illustrates a simulated plot showing the hysteresis effects of the differential amplifier of the present invention as illustrated in FIG. 4, as the inputs transition from positive to negative. As can be seen in the plot of FIGS. 9A and 9B, the transition point of the output signal waveform is offset by approximately plus or minus 50 mV from zero according to the transition direction of the input signal waveform. Because of the hysteresis effects of this circuit, the gain of the differential amplifier at the output transition or trip point is infinite. Because the transition point of the output signal is offset from zero, once the input signal is beyond the transition point, noise does not cause an unwanted reverse transition in the output signal.

The transistors 205 and 206 should be designed to be large enough to cause the denominator of the equation (4) to go to zero. In contrast to the oscillators of the prior art, the oscillator of the present invention does not require a kick by a startup signal to start oscillating. Because of the high gain associated with the differential amplifier of the present invention, the oscillator will begin oscillating automatically.

Figure 8A:
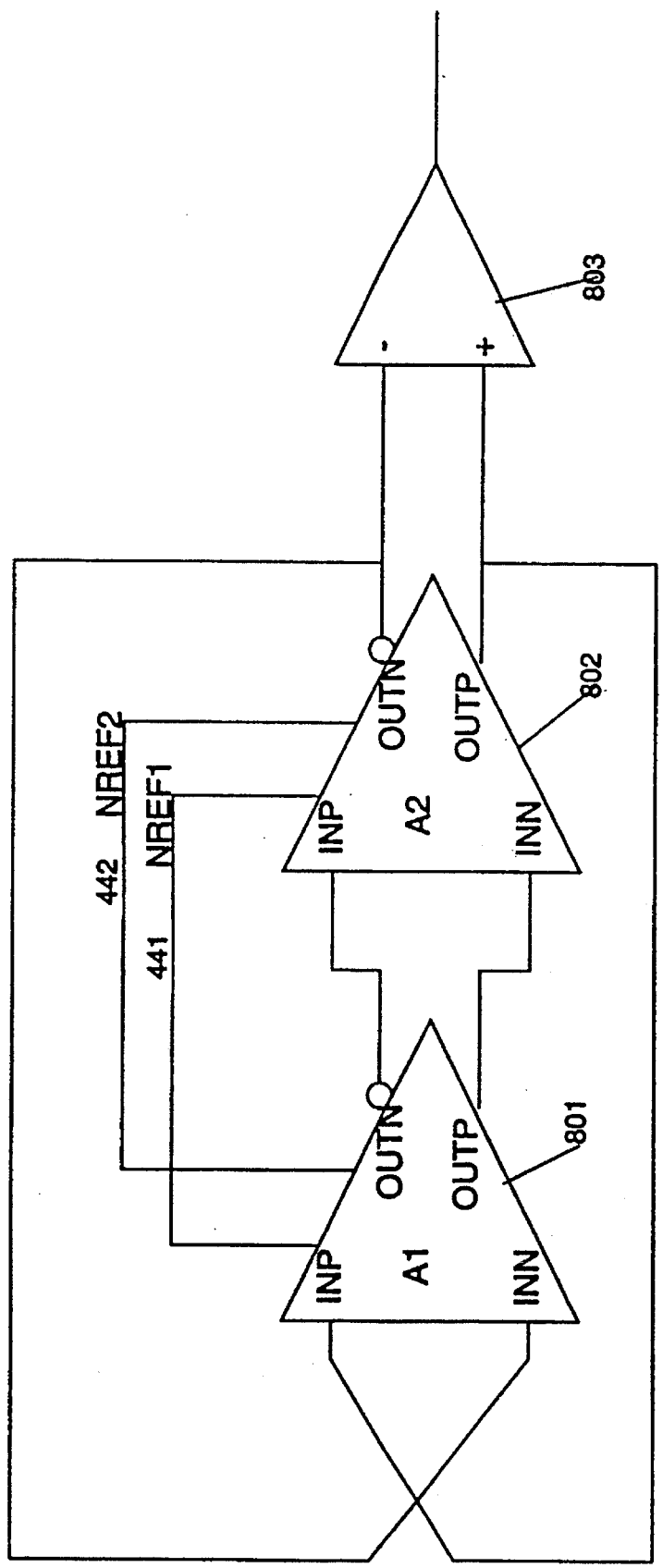
FIG. 8A illustrates a two stage oscillator containing the improved differential amplifier of the present invention within each stage.
Figure 8B:
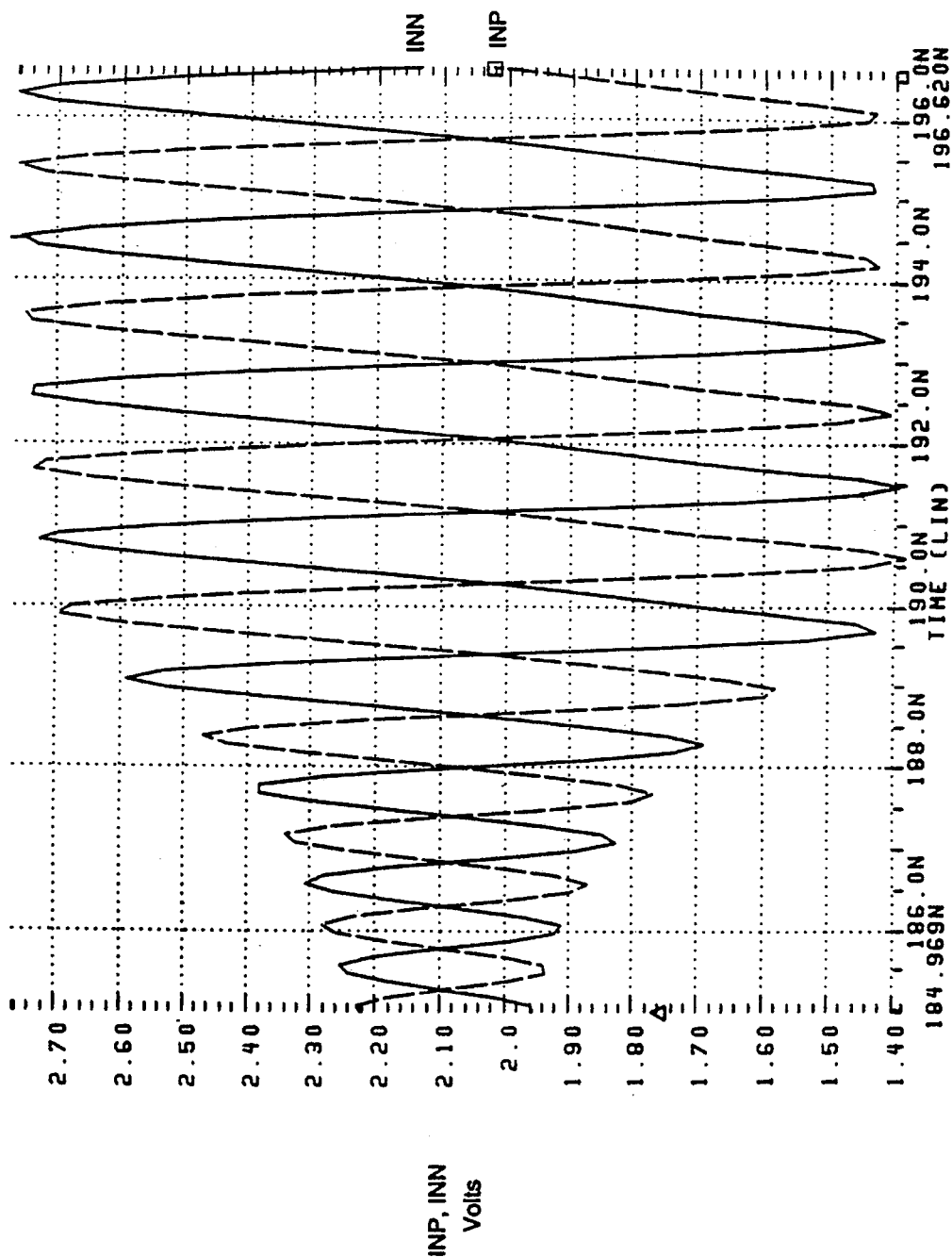
FIG. 8B illustrates the output waveform showing the startup of the two-stage oscillator.

FIGS. 8A and 8B illustrate the connection and startup of a two-stage oscillator, with each stage comprised of a differential amplifier of the present invention as illustrated in FIG. 4. The oscillator circuit illustrated in FIG. 8A includes the first amplifier stage 801 and the second amplifier stage 802, each having a differential input and a differential output. The differential output of the first stage 801 is coupled as the differential input to the second stage 802. The differential output of the second stage 802 is coupled as the differential input to the operational amplifier 803 and is inverted and coupled as the differential input to the first stage 801. The operational amplifier 803 is used to convert the dual-ended output of the second stage 802 into a single-ended waveform which can be used as a reference signal for other circuitry.

FIG. 8B illustrates the oscillation output waveform of the second stage 802 during startup of the oscillator. Only a small amount of noise is required in order to startup the two-stage oscillator of FIG. 8A, thus eliminating the need for a kick as required by the circuits of the prior art. Once the oscillation begins, the amplitude of the voltage increases until it is clipped by the clipper transistors and limited to the range of one transistor threshold or approximately 1.2 V. A relatively high frequency can also be reached using this two-stage oscillator. As illustrated in the waveform of FIG. 8B, a period of 1.8 ns and a frequency of 555 MHz is achieved using the two-stage oscillator.

The oscillator of the present invention improves the peak-to-peak jitter of the output waveform from 244 picoseconds (ps) for the prior art oscillator taught by Young et al. to less than 80 ps.

While the substrate connections have been left off of the figures, the appropriate connections will be apparent to one of ordinary skill in the art. For example, the p-channel transistors substrate connections used in the present invention are tied to the positive supply while the n-channel transistors substrate connections are tied to the negative supply. Otherwise, the transistor substrate connections may be coupled to the corresponding source of the transistor.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

I claim:

1. A multistage voltage controlled oscillator for selectively generating a frequency variable clock signal comprising:

a. a plurality of circularly cascade-coupled differential amplifier stages, each of the plurality having a differential input and a differential output;

b. a differential control signal coupled to each of the plurality of amplifier stages for controlling the frequency of the clock signal; and c. means for generating the differential control signal from a single ended control voltage having:
   i. a first means for generating a first bias voltage responsive to the single ended control voltage;
   ii. a second means for generating a second bias voltage responsive to the single ended control voltage;
   iii. a first p-type transistor having a first gate, a first source and a first drain, wherein the first gate is coupled to the first bias voltage and the first source is coupled to a first power supply voltage;
   iv. a second p-type transistor having a second gate, a second source and a second drain, wherein the second gate is coupled to the second bias voltage and the second source is coupled to the first drain;
   v. a third p-type transistor having a third gate, a third source and a third drain, wherein the third gate is coupled to the first bias voltage and the third source is coupled to the first power supply voltage;
   vi. a fourth p-type transistor having a fourth gate, a fourth source and a fourth drain, wherein the fourth gate is coupled to the second bias voltage, and the fourth source is coupled to the third drain;
   vii. a fifth n-type transistor having a fifth gate, a fifth source and a fifth drain, wherein the fifth gate is coupled to the fifth drain, the fourth drain and a first end of the differential control signal, the fifth drain is coupled to the fourth drain and the first end of the differential control signal, and the fifth source is coupled to a second power supply voltage;
   viii. a sixth n-type transistor having a sixth gate, a sixth source and a sixth drain, wherein the sixth gate is coupled to the fifth gate, the fourth drain and the first end of the differential control signal, the sixth drain is coupled to the second drain and a second end of the differential control signal; and
   ix. a seventh n-type transistor having a seventh gate, a seventh source and a seventh drain, wherein the seventh gate is coupled to the second drain, the sixth drain, and the second end of the differential control signal, the seventh drain is coupled to the sixth source, and the seventh source is coupled to the second power supply voltage.

2. The multistage voltage controlled oscillator as claimed in claim 1 wherein the plurality of cascade-coupled differential amplifier stages comprises a first, second and third stage, wherein the differential output of the first stage is coupled to the differential input of the second stage, the differential output of the second stage is coupled to the differential input of the third stage and the differential output of the third stage is coupled to the differential input of the first stage.

3. The multistage voltage controlled oscillator as claimed in claim 2 wherein the frequency variable clock signal is generated from the differential output of the third stage.

4. A differential amplifier and control circuit coupled between a first power supply voltage and a second power supply voltage and further coupled to receive a differential input signal, comprising:
   a. a differential amplifier having:
      i. a first transistor having a first gate, a first source and a first drain, wherein the first gate is coupled to the differential input signal;
      ii. a second transistor having a second gate, a second source and a second drain, wherein the second gate is coupled to the differential input signal and the second source is coupled to the first source;
      iii. a third transistor having a third gate, a third source and a third drain, wherein the third gate is coupled to the third drain and to the first drain and the third source is coupled to the second drain;
      iv. a fourth transistor having a fourth gate, a fourth source and a fourth drain, wherein the fourth gate is coupled to the fourth drain, to the second drain and to the third source and the fourth source is coupled to the first drain, the third drain and the third gate wherein a differential output signal is measured between a first output node formed at the fourth drain and a second output node formed at the fourth source, thereby automatically limiting a substantially symmetrical swing of the differential output signal;
      v. a fifth transistor having a fifth gate, a fifth source and a fifth drain, wherein the fifth gate is coupled to the second drain, the third source, the fourth gate and the fourth drain, the fifth drain is coupled to the first drain, the third gate, the third drain and the fourth source and the fifth source is coupled to the first power supply voltage; and
      vi. a sixth transistor having a sixth gate, a sixth source and a sixth drain, wherein the sixth gate is coupled to the first drain, the third gate, the third drain, the fourth source and the fifth drain, the sixth drain is coupled to the second drain, the third source, the fourth gate, and the fourth drain and the sixth source is coupled to the fifth source and the first power supply voltage; and
   b. means for generating a control current coupled to a control signal, the first source, the second source and the second power supply voltage for controlling a time of formation of the differential output signal.

5. The differential amplifier as claimed in claim 4 wherein the means for generating a control current comprises a variable current source for controlling the frequency response of a differential output signal in response to the control signal.

6. The differential amplifier as claimed in claim 5 wherein the differential amplifier comprises a first stage of an oscillator and wherein the oscillator further comprises a second stage and a third stage, each identical to the first stage and each stage having a differential input and a differential output, and further wherein the differential output of the first stage is coupled to the differential input of the second stage, the differential output of the second stage is coupled to the differential input of the third stage and the differential output of the third stage is coupled to the differential input of the first stage and further wherein the control signal is common to all three stages.

7. The multistage voltage controlled oscillator as claimed in claim 1 wherein the plurality of cascade-coupled differential amplifier stages comprises a first and second stage, wherein the differential output of the first stage is coupled to the differential input of the second stage and the differential output of the second stage is coupled to the differential input of the first stage.

8. The multistage voltage controlled oscillator as claimed in claim 7 wherein the frequency variable clock signal is generated from the differential output of the second stage.

9. The differential amplifier as claimed in claim 5 wherein the differential amplifier comprises a first stage of an oscillator and wherein the oscillator further comprises a second stage identical to the first stage having a differential input and a differential output, and further wherein the differential output of the first stage is coupled to the differential input of the second stage, the differential output of the second stage is coupled to the differential input of the first stage and further wherein the control signal is common to both stages.

10. The differential amplifier as claimed in claim 5 wherein the variable current source comprises:
   a. a seventh transistor having a seventh gate, a seventh source and a seventh drain, wherein the seventh gate is coupled to a first end of a differential control signal responsive to the control signal, the seventh drain is coupled to the first source and the second source;
   b. an eighth transistor having an eighth gate, an eighth source and an eighth drain, wherein the eighth gate is coupled to a second end of a differential control signal responsive to the control signal, the eighth drain is coupled to the seventh source, and the eighth source is coupled to the second power supply voltage.

11. The differential amplifier as claimed in claim 10 wherein the variable current source further comprises a means for generating the differential control signal from the control having:
   a. a first means for generating a first bias voltage responsive to the control signal;
   b. a second means for generating a second bias voltage responsive to the control signal;
   c. a ninth transistor having a ninth gate, a ninth source and a ninth drain, wherein the ninth gate is coupled to the first bias voltage and the ninth source is coupled to the first power supply voltage;
   d. a tenth transistor having a tenth gate, a tenth source and a tenth drain, wherein the tenth gate is coupled to the second bias voltage and the tenth source is coupled to the ninth drain;
   e. an eleventh transistor having an eleventh gate, an eleventh source and an eleventh drain, wherein the eleventh gate is coupled to the first bias voltage and the eleventh source is coupled to the first power supply voltage;
   f. a twelfth transistor having a twelfth gate, a twelfth source and a twelfth drain, wherein the twelfth gate is coupled to the second bias voltage, and the twelfth source is coupled to the eleventh drain;
   g. a thirteenth transistor having a thirteenth gate, a thirteenth source and a thirteenth drain, wherein the thirteenth gate is coupled to the thirteenth and twelfth drains and a first end of the differential control signal, the thirteenth drain is coupled to the twelfth drain and the first end of the differential control signal, and the thirteenth source is coupled to the second power supply voltage;
   h. a fourteenth transistor having a fourteenth gate, a fourteenth source and a fourteenth drain, wherein the fourteenth gate is coupled to the thirteenth gate, twelfth drain and the first end of the differential control signal, the fourteenth drain is coupled to the tenth source and a second end of the differential control signal; and
   i. a fifteenth transistor having a fifteenth gate, a fifteenth source and a fifteenth drain, wherein the fifteenth gate is coupled to the tenth drain, the fourteenth drain, and the second end of the differential control signal, the fifteenth drain is coupled to the fourteenth source, and the fifteenth source is coupled to the second power supply voltage.

* * * * *